United States Patent [19]

Ruvalds

[11] 4,043,809
[45] Aug. 23, 1977

[54] HIGH TEMPERATURE SUPERCONDUCTORS AND METHOD

[76] Inventor: John J. Ruvalds, 245 Colonnade Drive, Apt. 11, Charlottesville, Va. 22901

[21] Appl. No.: 689,252

[22] Filed: May 24, 1976

[51] Int. Cl.² .................. C22C 19/03; C22C 30/02
[52] U.S. Cl. .................. 75/134 N; 75/134 C; 75/134 F; 75/159; 75/165; 75/170; 75/173 R; 75/173 C; 423/644
[58] Field of Search ............ 55/16, 74; 423/644; 75/170, 159, 165, 134 F, 134 C, 134 N, 173 R, 173 C

[56] References Cited

U.S. PATENT DOCUMENTS

| | | | |
|---|---|---|---|
| 2,739,256 | 3/1956 | Elsey | 310/231 |
| 2,785,046 | 3/1957 | Butler | 23/14.5 |
| 3,382,106 | 5/1968 | Jung et al. | 136/120 |
| 3,438,819 | 4/1969 | Hicks | 136/241 |
| 3,720,752 | 3/1973 | Van Houten | 423/255 |
| 3,776,508 | 12/1973 | Katz | 252/301.1 R |
| 3,776,855 | 12/1973 | Raymond et al. | 252/301.1 R |
| 3,793,435 | 2/1974 | Reilly et al. | 423/248 |
| 3,825,418 | 7/1974 | Reilly et al. | 75/159 |
| 3,829,552 | 8/1974 | Reed | 423/255 |

OTHER PUBLICATIONS

W. L. McMillan, "Transition Temperature of Strong-- Coupled Superconductors", Physical Review, vol. 167, pp. 331-167 (1968).

T. Skoskiewicz, "Superconductivity in the Palladium--Hydrogen and Palladium–Nickel–Hydrogen Systems", Phys. Stat. Sol. (a), vol. 11, K123 (1972).

B. Stritzker, "High Superconducting Transition Temperatures in the Palladium–Noble Metal–Hydrogen System", Z. Physik, vol. 268, pp. 261-264 (1974).

D. A. Papaconstantopoulos and B. M. Klein, "Superconductivity in the Palladium–Hydrogen System", Physical Review Letters, vol. 35, pp. 110-113 (1975).

Primary Examiner—L. Dewayne Rutledge
Assistant Examiner—E. L. Weise
Attorney, Agent, or Firm—Pennie & Edmonds

[57] ABSTRACT

This invention comprises a superconductive compound having the formula:

$$Ni_{1-x}M_xZ_y$$

wherein M is a metal which will destroy the magnetic character of nickel (preferably copper, silver or gold); Z is hydrogen or deuterium; $x$ is 0.1 to 0.9; and $y$, correspondingly, 0.9 to 0.1, and method of conducting electric current with no resistance at relatively high temperature of $T > 1°$ K comprising a conductor consisting essentially of the superconducting compound noted above.

12 Claims, No Drawings

HIGH TEMPERATURE SUPERCONDUCTORS AND METHOD

BACKGROUND OF THE INVENTION

Superconductivity refers to those properties of a material which enable it to conduct electrical current with zero resistance. This effect was discovered in 1911 by Onnes [Comm. Phys. Lab. Univ. Leiden Nos. 119, 120, 122 (1911)] and studied extensively by researchers in various laboratories.

In most of the materials studied to date the superconducting properties vanish at temperatures larger than a critical temperature $T_c$ which is determined primarily by empirical methods. Thus, elements, such as Pb and Nb, have been found to be superconducting at very low temperatures. Metals like Nb are presently used in the construction of high field magnets and other applications where electrical energy dissipation is a major factor. The technological utility of such metals is limited due to the expensive refrigeration systems required to cool the materials to liquid helium temperatures of about 4.2° K in order for the superconducting properties to be present.

The search for superconductors with higher transition temperatures has led to the discovery of various compounds with $T_c \cong 20°$ K. Some examples are $Nb_3Ge$, $Nb_3Sn$, PdH, PdD, and PdCuH. The highest $T_c$ material discovered so far is $Nb_3Ge$ with $T_c = 23.2°$ K. As such, costly refrigeration methods must also be employed to use these compounds as superconducting wires. Also, many of the presently available high temperature superconductors such as $Nb_3Ge$ with $T_c = 23°$ K, are difficult to manufacture and contain relatively expensive ingredients.

It should be noted that some substances are not superconducting at all. This group of materials includes the elements Cu, Ni, Pd and compounds such as NiH.

The large scale applications of superconductivity include energy transmission, energy generation, magnetic levitation of trains, and many other uses with involve electrical current flow. At present, these applications are limited primarily by the high cost of refrigeration required to cool the materials to their superconducting temperatures, and by the capital costs involved in the development and production of appropriate superconducting materials. It has not been possible, heretofore, to obtain superconductivity at temperatures above $T_c = 25°$ K or, more importantly, at about the boiling point of liquid nitrogen, i.e., 77° K.

SUMMARY OF THE INVENTION

Inexpensive high temperature superconductors are now possible.

Briefly stated, the present invention comprises a superconductive compound having the formula:

$$Ni_{1-x}M_xZ_y$$

wherein M is a metal which will destroy the magnetic character of nickel, preferably copper, silver, gold or mixtures thereof; Z is hydrogen or deuterium; x is 0.1 to 0.9; and y, correspondingly, 0.9 to 0.1; the method of conducting electric current with no resistance at a temperature of T > 1° K, preferably 25° K, comprising a conductor consisting essentially of the superconductive compound noted above; and an electric conductor consisting essentially of the superconductive compound noted above.

DETAILED DESCRIPTION

In accordance with the present invention, the essential elements are the use of nickel alloyed with an element capable of destroying the innate magnetic character of nickel and forming the hydride or deuteride of said alloy. As to the elements for destroying the magnetic characteristic of nickel it has been found that copper is the preferred element but that, also, silver and gold can be used as well as mixtures of these elements. The nickel and magnetism destroying element can be alloyed by any of the conventional methods used to alloy metals and it is preferred to have in the alloy equal parts of nickel and the magnetism destroying compound; e.g., an atomic ratio of 0.5 nickel and 0.5 copper. However, good results are also obtained in alloys containing atomic ratios of 0.1 to 0.9 nickel and, correspondingly, 0.9 to 0.1 the other metal.

The hydrides and deuterides of the alloy can be formed using any of the conventional techniques employed for this purpose; namely, by first forming the alloy and then heating the same to a high temperature in the presence of hydrogen or deuterium. Ion implantation and electrolytic techniques can also be used to form the hydride and deuterides. Such techniques are conventional and well known in the art and are described, for example, in the text "Metal Hydrides" by W. M. Mueller, J. P. Blackledge, and G. G. Libowitz, Academic Press, New York, 1968.

With respect to the ratios of elements in the compound deuteride, it can be as follows:

$$Ni_{1-x}M_xZ_y$$

in which x is 0.1 to 0.9 and y, correspondingly 0.9 to 0.1; Z being the hydrogen or deuterium. It is preferred to use 0.7 of hydrogen per alloy atom. The preferred compound is one in which the alloy comprises an atomic ratio of equal parts of nickel and copper and 0.7 of hydrogen per alloy atom.

It is contemplated that the $T_c$ of the nickel-copper hydrides of the present invention will be approximately 20° K or even higher and possibly up to 70° K. This means that the compounds in the present invention can be formed into wires, cables, thin films, or coils for magnets, as well as other electrical conductors, and will have superconducting properties at temperatures at least about the boiling point of liquid helium (about 4° K) and up to that of liquid nitrogen (about 77° K). This will greatly expand the ability to have resistance-free energy transmission generation and, in general, resistance-free electrical current flow at economically usable temperatures. Once made, the compounds can be formed into wires, cables, films, etc. . . . for use as electrical conductors by means of any of the suitable apparatus presently available for that purpose.

While the exact theory for the present invention is subject to uncertainties, it is believed that the superconductive nature of the instant nickel compounds as opposed to the non-superconductive properties of nickel or nickel hydride is due to the destruction of the magnetic character of the nickel.

An explanation of the superconductive properties of elements and compounds is gained from the expression developed by Bardeen et al. [Bardeen et al, Phsy. Rev.

106, 162 (1957); 108, 1175 (1957)], hereinafter called the BCS expression.

$$T_c \cong \omega_o \exp\left(\frac{-1}{N(o)V}\right), \quad (1)$$

where $\omega_o$ is a typical phonon (sound wave) frequency, $N(o)$ is the density of electron states at the Fermi energy, and $V$ is the effective interaction energy between two electrons: the coupling must be attractive ($N(o)V$ positive in this notation) to obtain a pairing of electrons which leads to superconductivity. The net interaction between electrons can be expressed as $$N(o)V \cong \lambda - \mu^*, \quad (2)$$

where $\lambda$ is the attractive compound arising from electron-phonon interactions and $\mu^*$ represents the completing repulsion due to Coulomb forces.

The best (highest $T_c$) superconductors would then be characterized by the largest electron-phonon coupling $\lambda$ and the smallest repulsion term $\mu^*$.

Finally we may estimate the transition temperatures of some nickel compounds on the basis of the above theory. First of all, pure nickel is ferromagnetic and non-superconducting. This has been attributed to a large effecive repulsion $\mu^*$ between electrons which overcomes the attractive forces due to phonon coupling: hence $\mu_{Ni}^* \geq \lambda_{Ni}$ and $T_c = 0$.

The case of Nickel Hydride has been considered in band structure calculations of the electronic properties. The results indicate a much larger electronic density of states $N(o)$ in NIH than the corresponding density of PdH. Consequently the parameter $\lambda$ should be enormously larger in NiH than in any of the cases discussed above and result in a superior superconductor with very high $T_c$. Specifically the calculated values are $N_{NiH}(o) = 4.5H_{PdH}(o)$ and correspondingly we estimate $\lambda_{NiH} \cong 2$. More accurate estimates require detailed calculations of the type given by Papaconstantopoulos et al., Phys. Rev. Lett. 35, 110 (1975).

Experiments on NiH have shown that this compound is unfortunately not superconducting. Again the explanation of this case rests on the magnetic properties of nickel which imply a large value of $\mu^*$ and consequent inability of the electrons to form superconducting pairs.

Clearly the nickel hydride systems would be excellent superconductors if one could destroy the innate magnetic character of nickel and thus reduce $\mu^*$. The destruction of magnetism by addition of copper favors the NiCuH alloy. A crude estimate of the $T_c$ for this material is (from Eq. 2):

$$R_c(NiCuH) \cong 200 \exp\left(\frac{-1}{2-1}\right) \cong 70° K.$$

By necessity this estimate is crude. However, the result is extremely promising despite the relatively large value of $\mu^* = 1$ which was used to obtain a reasonable estimate of $T_c$. Similar considerations apply to NiAgH and NiAuH.

Small changes in the $\lambda$ and $\mu^*$ parameters of course yield very large variations in $T_c$ as is evident from formula (2). In this regard there are the prospects of achieving superconductivity of these alloys at temperatures exceeding the boiling point of liquid nitrogen (77° K).

Of primary importance in the superconducting transition temperatures of NiCuH is the remarkably large density of states at the Fermi energy which has been found in specific heat measurements on NiH by Wolf and Baranowski, J. Phys. Chem. Solids 32, 1649 (1971). The high electronic density of states of NiH has been attributed to s-state electrons, whereas the d-state electrons are primarily involved in the magnetic behavior of metals. This point is supported by calculations of Switendick, Berichte der Bunsen-Gesellschaft fur Physikalische Chemie, 76, 535 (1972). However, there may be an additional and significant increase in $\lambda$ due to the interactions of the hydrogen phonon modes with the sound waves characteristic of the nickel alloys. My results for this effect are in agreement with the data on neutron experiments of PdD, and are expected to enhance the superconducting character of the instant $Ni_{1-x}M_xZ_y$ compounds.

Finally, there is the uncertain nature of the Coulomb pseudo-potential $\mu^*$ which has not yet been amendable to accurate calculations. Nonetheless, the arguments presented above yield logical estimates as to the $T_c$ of the compounds of the present invention, especially since the desired reduction in $\mu^*$ is related to the destruction of magnetism in the nickel compounds which has been achieved with NiH and NiCu.

While the invention has been described in connection with preferred embodiments, it is not intended to limit the invention to the particular forms set forth, but on the contrary, it is intended to cover such alternatives, modifications, and equivalents as may be included within the spirit and scope of the invention as defined by the appended claims.

What is claimed is:

1. A superconductive compound having the formula:

$$Ni_{1-x}M_xZ_y$$

wherein M is a metal which will destroy the magnetic character of nickel; Z is hydrogen or deuterium; $x$ is 0.1 to 0.9; and $y$, correspondingly 0.9 to 0.1.

2. A superconductive compound having the formula:

$$Ni_{1-x}M_xZ_y$$

wherein M is a metal selected from copper, silver, gold or mixtures thereof; Z is hydrogen or deuterium; $x$ is 0.1 to 0.9; and $y$, correspondingly, 0.9 to 0.1.

3. The superconductive compound of claim 1 wherein M is copper and Z is hydrogen.

4. The superconductive compound of claim 1 wherein M is silver and Z is hydrogen.

5. The superconductive compound of claim 1 wherein M is gold and Z is hydrogen.

6. An electrical conductor for conducting electrical current with no resistance at a temperature of $T > 1° K$ consisting essentially of the superconductive compound of claim 1.

7. The electrical conductor of claim 6 wherein the superconducting compound is that of claim 2.

8. The electrical conductor of claim 6 wherein the superconductive compound is that of claim 3.

9. The electrical conductor of claim 6 wherein the superconductive compound is that of claim 4.

10. The electrical conductor of claim 6 wherein the superconductive compound is that of claim 5.

11. The electrical conductor of claim 6 in the form of a wire, cable, thin film, or magnetic coil.

12. A superconductive wire or cable superconducting at $T > 1° K$ consisting essentially of $Ni_{0.5}Cu_{0.5}H_{0.7}$.

* * * * *